United States Patent [19]

Teuling

[11] Patent Number: 4,464,612
[45] Date of Patent: Aug. 7, 1984

[54] CIRCUIT ARRANGEMENT FOR A PICTURE DISPLAY DEVICE FOR GENERATING A SAWTOOTH-SHAPED LINE DEFLECTION CURRENT

[75] Inventor: Dirk J. A. Teuling, Eindhoven, Netherlands

[73] Assignee: U.S. Philips Corporation, New York, N.Y.

[21] Appl. No.: 337,918

[22] Filed: Jan. 8, 1982

[30] Foreign Application Priority Data

Jan. 13, 1981 [NL] Netherlands ..................... 8100118

[51] Int. Cl.³ ..................... H01J 29/70; H01J 29/76
[52] U.S. Cl. ..................................... 315/408
[58] Field of Search ............................. 315/408, 399

[56] References Cited

U.S. PATENT DOCUMENTS

| 4,206,388 | 6/1980 | Ishigaki et al. | 315/408 |
| 4,234,827 | 11/1980 | Willis | 315/408 |
| 4,242,714 | 12/1980 | Yoshida et al. | 315/408 |

Primary Examiner—Theodore M. Blum
Attorney, Agent, or Firm—Thomas A. Briody; William J. Streeter

[57] ABSTRACT

A circuit arrangement for a picture display device for generating a sawtooth-shaped line deflection current, at least two controllable deflection switches which are switched at line frequency and are arranged in series. As a result thereof the line deflection coil is connected to a trace capacitor during the trace period. During the retrace period the two switches are rendered non-conductive substantially simultaneously and the coil, the trace capacitor and a retrace capacitance form a resonant network the elements of which determine the duration of the retrace period. Supply energy is supplied from a supply voltage source by means of a supply winding which is divided in at least two winding portions which are each connected by means of one end through a supply diode to the resonant network and by means of the other end to a deflection switch and are coupled to the source via a controllable supply switch, which switches at the line frequency. During at least a portion of the trace period the supply switch is in the conducting state while the supply diodes are non-conducting and are non-conducting during the remaining portion of the line period while the supply diodes conduct. The conduction period of the supply switch may be adjustable to adjust the amplitude of the deflection current and also to stabilize this current versus fluctuations of the supply voltage. The said amplitude does not depend on the line frequency.

15 Claims, 7 Drawing Figures

CIRCUIT ARRANGEMENT FOR A PICTURE DISPLAY DEVICE FOR GENERATING A SAWTOOTH-SHAPED LINE DEFLECTION CURRENT

BACKGROUND OF THE INVENTION

1. Field of the Invention

The invention relates to a circuit arrangement for a picture display device for generating a sawtooth-shaped deflection current having a trace and a retrace through a line deflection coil which during the trace period is connected to a trace capacitor by means of at least two series-arranged controllable deflection switches switched at the line frequency, said switches being non-conducting substantially simultaneously during the retrace period, the deflection coil, the trace capacitor and circuit elements which together form a retrace capacitance being part in said retrace period of a resonant network the elements of which determine the duration of the retrace period, the circuit arrangement also comprising a supply winding coupled to a supply voltage source for supplying supply energy to the resonant network during the retrace period.

2. Description of the Prior Art

Such a circuit is disclosed in U.S. Pat. No. 3,030,444. This prior art circuit has the advantage that the high voltage present across the deflection coil during the retrace period is distributed over two switches. In television receivers for which the known circuit is intended the line frequency has the value prescribed by the television standard, for example 15.75 kHz for the U.S. standard. For picture display devices for which a higher quality than for the now customary television receivers is desired a higher value may be opted for. This is particularly the case for picture display tubes having a high resolution which are used, for example, to display digitally generated pictures and wherein the line frequency has a value which may be located between 15 and 64 kHz.

The known circuit is also suitable for a line frequency other than 15.75 kHz, however on the condition that the supply voltage is given a different value so that also the trace voltage, i.e. the voltage across the trace capacitor and thereto gets a different value. Otherwise the amplitude of the line deflection current and consequently the width of the displayed picture would not be correct. If the line deflection circuit must be suitable for different values of the line frequency then the value of the supply voltage must be controllable, at least adjustable. Such an adjustment usually results in considerable losses. As, in addition, the supply voltage circuit which provides supply energy to the line deflection circuit usually has further loads which must not be affected by this adjustment, an adjustable, non-dissipative supply voltage circuit is difficult to realize.

The invention has as an object to provide a circuit of the above-mentioned type in which the amplitude of the generated line deflection current is substantially independent of the value of the line frequency and can be adjusted with simple, low-dissipation means to the desired value. According to the invention, the circuit is therefore characterized in that the supply winding is divided into at least two winding portions which are each connected by means of one end through a supply diode to the resonant network and by means of the other end to an associated deflection switch and are coupled to the supply voltage source via a controllable supply switch also switched at the line frequency, said supply switch being conducting during at least a portion of the trace period for storing supply energy in the supply winding when the supply diodes are non-conducting, and non-conducting during the remaining portion of the line period when the supply diodes are conducting, current flowing through the supply diodes during the retrace period replenishing losses.

SUMMARY OF THE INVENTION

Preferably, the circuit arrangement according to the invention is characterized in that the conduction period of the supply switch is adjustable for the adjustment of the amplitude of the deflection current and in that the conduction period of the supply switch is adjustable in dependence on the supply voltage. In accordance with this measure the amplitude of the generated deflection current is also independent of the supply voltage. The conduction period of the supply switch may also be modulatable at the field frequency for correcting for raster distortion.

The circuit arrangement may be characterized in that a junction between the deflection switches is connected to a point of reference potential. One characterizing feature of the circuit arrangement may be that a retrace capacitor on the one hand and the series arrangement of the associated winding portion and a supply diode on the other hand are in parallel with each deflection switch, the ratio between the capacitance of the first retrace capacitor and the capacitance of the second retrace capacitor being equal to the ratio between the number of turns of the second winding portion and the number of turns of the first winding portion and in that the series arrangement of a trace capacitor and a line deflection coil half is in parallel with each deflection switch.

An extension of the circuit arrangement may be characterized in that a third deflection switch is arranged in series with the two deflection switches, a third retrace capacitor on the one hand and the series arrangement of a third winding portion of the supply winding and a third supply diode on the other hand being in parallel with the third deflection switch.

In a variant the circuit arrangement is characterized in that the first deflection switch comprises the series arrangement of the supply switch which is capable of conduction in one direction only and a diode having the same direction of conduction, while a further diode which conducts in the opposite direction is arranged in a parallel branch, the junction between the deflection switches being connected to a point of reference potential and the supply switch and the second deflection switch being rendered non-conductive substantially simultaneously at the end of the trace period.

Advantageously, the circuit arrangement may be characterized in that the winding portions are secondary windings of a transformer the primary winding of which is arranged in series with the supply switch, the series arrangement thus formed being connected to the supply voltage source.

A circuit arrangement in which each the deflection switch comprises a controllable switch which is capable of conduction in one direction only and a diode arranged in parallel therewith the conductivity of which is opposite to that of the switch, may be characterized in that a voltage source is arranged in series with each diode for maintaining the diode in the conductive state at least at the turn-on instant of the associated switch.

In one embodiment the circuit arrangement is characterized in that the control electrode of a deflection switch is connected to a secondary winding of a driver transformer the primary winding of which is connected to a current source, both windings carrying current simultaneously for bringing to and maintaining the deflection switch in the conductive state and in that the control electrode is also connected to a transistor for rendering the deflection switch non-conductive.

The circuit arrangement according to the invention may be characterized in that means for feeding back a retrace voltage to control means of the supply switch is provided for controlling the conduction period thereof, or may be characterized in that the control means for the supply switch comprises a sawtooth voltage generator and a comparison stage for generating a pulse-shaped signal, and edge of the generated control signal being adjustable in dependence on a d.c. voltage and a signal of the field frequency, while the slope of the sawtooth voltage is variable under the influence of the supply voltage.

A circuit arrangement in which each deflection switch comprises a controllable switch which is capable of conduction in one direction only and a diode arranged in parallel therewith the conductivity is in the direction opposite thereto may be characterized in that the two said controllable switches are gate turn off switches.

The invention will now be further described by way of non-limitative example with reference to the accompanying drawings.

DESCRIPTION OF THE PREFERRED EMBODIMENTS

Figure 1:
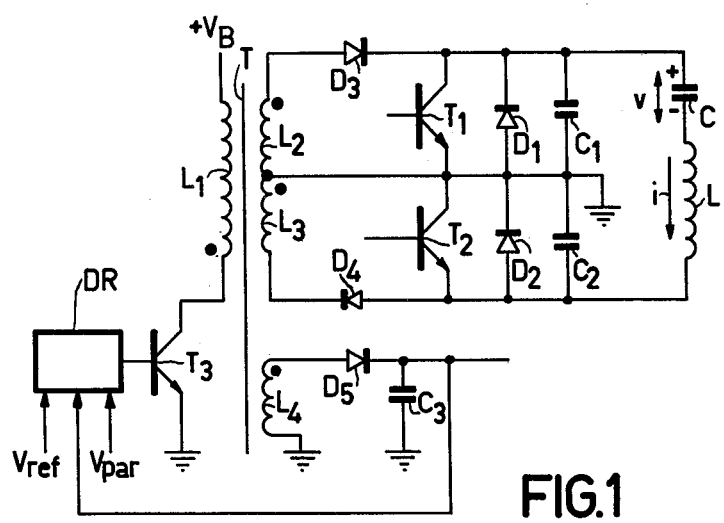
FIG. 1 shows the basic circuit diagram of a circuit arrangement in accordance with the invention.

In FIG. 1 L is a line deflection coil for the electromagnetic deflection in the horizontal direction of one or more electron beam(s) which are generated in a picture display tube, not shown. A trace capacitor C is arranged in series therewith. The series arrangements of two npn switching transistors $T_1$ and $T_2$, of two diodes $D_1$ and $D_2$ and of two retrace capacitors $C_1$ and $C_2$ are arranged in parallel with the network thus formed. The emitter of transistor $T_1$ is connected to the collector of transistor $T_2$ and the anode of diode $D_1$ is connected to the cathode of diode $D_2$. The capacitors $C_1$ and $C_2$ have substantially the same capacitances.

The primary winding $L_1$ of a transformer T is connected by means of one end to the positive terminal of a supply voltage source $V_B$ and by means of its other end to the collector of a further npn switching transistor $T_3$. The emitter of transistor $T_3$ is connected to the negative terminal, which is connected to ground, of source $V_B$. The anode of a further diode $D_3$ is connected to one end of a secondary winding $L_2$ of transformer T. The cathode of said diode is connected to the junction of capacitors C and $C_1$, to the cathode of diode $D_1$ and to the collector of transistor $T_1$. In a similar manner one end of a second secondary winding $L_3$ of transformer T is connected to the cathode of a diode $D_4$, the anode of which is connected to the junction of coil L with capacitor $C_2$ and the anode of diode $D_2$ and to the emitter of transistor $T_2$.

Windings $L_2$ and $L_3$ have the same number of turns and are interconnected and connected to the junction of transistors $T_1$ and $T_2$, of diodes $D_1$ and $D_2$ and of capacitors $C_1$ and $C_2$. Said junction is connected to a reference potential, for example the potential of the said ground. The winding senses of windings $L_1$, $L_2$ and $L_3$ is indicated in FIG. 1 by means of dots. For simplicity, the control means provided in the base leads of transistors $T_1$ and $T_2$ are not shown.

If in the first instance the capacitance of capacitor C is assumed to be infinitely large, then it is assumed that the voltage across capacitor C, the trace voltage v, remains constant. During a portion, the trace period, of the line period the switches formed by transistor $T_1$ and diode $D_1$ and by transistor $T_2$ and diode $D_2$, respectively conduit, either the transistor or the diode conducting and it being possible to omit the diode if the transistor is capable of conduction in the reverse direction. In these circumstances voltage V is present across coil L during the whole trace period. Consequently, the line deflection current i flowing through coil L varies linearly and reverses direction at the central instant of the trace period. Prior to said instant the line deflection current flows through diodes $D_1$ and $D_2$ and through transistors $T_1$ and $T_2$ after said instant. This holds for a loss-less circuit. Positive control signals are in good time applied, prior to the said central instant to the bases of transistors $T_1$ and $T_2$.

The retrace is initiated at the instant at which transistors $T_1$ and $T_2$ are substantially simultaneously rendered non-conductive in response to a negative control signal which is applied in due time. During the retrace period the inductances and the capacitances of the circuit arrangement of FIG. 1 form a resonant network. The variation of current i is now determined by the network and is substantially sinusoidal. At the junction of elements $T_1$, $D_1$, $D_3$, C and $C_1$ the voltage increases above the ground potential in accordance with a substantially cosine function, while the voltage at that end of coil L which is the lower end in the drawing becomes negative in accordance with the same function. At the central instant of the retrace period current i reverses direction, while the first-mentioned voltage attains a maximum and the second voltage a minimum. A maximum voltage which is half the voltage which would be present across a single switch is present across each switch $T_1$, $D_1$ and $T_2$, $D_2$, respectively. The retrace period ends at the instant at which both voltages become negative again, as a result of which diodes $D_1$ and $D_2$ are rendered conductive.

During a portion of the trace period transistor $T_3$ is conductive in response to a control signal of line frequency applied to its base by means of a driver stage DR. The collector current of transistor $T_3$ then flowing through winding $L_1$ varies linearly with a constant slope if the voltage $V_B$ of the supply source is constant. During the trace period the voltages at the cathode of diode $D_3$ and at the anode of diode $D_4$ are zero. The winding senses of windings $L_1$, $L_2$ and $L_3$ as well as the direction of conduction of diodes $D_3$ and $D_4$ are chosen so that the diodes remain in the non-conducting state as long as current flows through winding $L_1$.

At the instant at which the conduction interval $\tau$ of transistor $T_3$ is ended, the voltage at the collector thereof, which has substantially zero, becomes positive. The voltage at the anode of diode $D_3$ also becomes positive while the voltage at the cathode of diode $D_4$ becomes negative. Both diodes conduct and windings $L_2$ and $L_3$ are substantially short-circuited by these diodes and by either transistors $T_1$ and $T_2$, or diodes $D_1$ and $D_2$. Consequently, a constant current flow through said windings and through diodes $D_3$ and $D_4$. The voltage across winding $L_1$ is also zero so that the voltage at the collector of transistor $T_3$ is equal to voltage $V_B$. During the retrace period the energy stored by the collector current of transistor $T_3$ in transformer T during interval $\tau$ continues to produce a current through diodes $D_3$ and $D_4$. This current decreases in accordance with the same sinusoidal function as current i while the positive retrace pulse present on the junction of capacitors C and $C_1$ is also present on the anode of diode $D_3$ and consequently also, however with a factor equal to the transformation ratio between the number of turns of winding $L_1$ and the number of turns of winding $L_2$, at the collector of transistor $T_3$. The same negative retrace pulse present on the lower end in the drawing of coil L is also present on the cathode of diode $D_4$. The same voltages prevail at the end of the retrace period as before that end, while the current through diodes $D_3$ and $D_4$ assumes a constant value which is lower but not equal to zero. This situation is retained until transistor $T_3$ is rendered conductive again.

Figure 2:
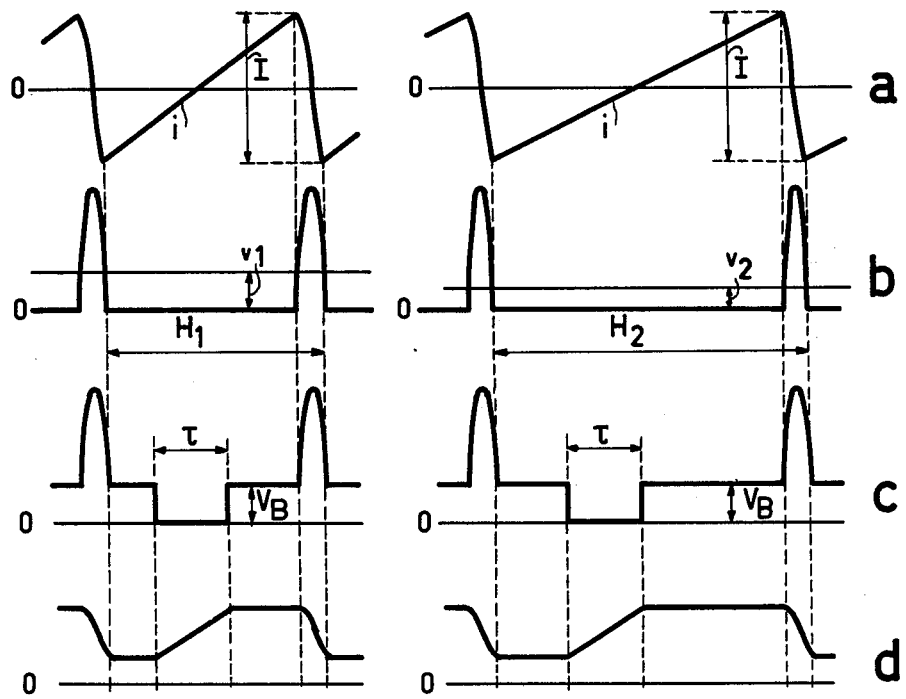
FIG. 2 shows waveforms occurring therein.

From the foregoing it appears that outside interval $\tau$ a current flows through diodes $D_3$ and $D_4$ to the deflection section of the circuit. During the retrace period the voltage across this section is unequal to zero and this current supply then supplies energy for replenishing the losses. A better understanding of the operation of the circuit of FIG. 1 will be obtained on the basis of the time diagrams plotted in FIG. 2 for two values of the line frequency, on the left for a determined value $f_1 = 1/H_1$ and on the right for a lower value $f_2 = 1/H_2$. Herein $H_1$ and $H_2$, respectively, represent the line period.

FIG. 2a shows the variation of current i. The amplitude I thereof must be the same in both cases to ensure that the width of the displayed picture does not vary at a variable line frequency. FIG. 2b shows the variation of the voltage at the collector of transistor $T_1$. As the duration of the retrace period is not determined by the line frequency but by the elements of the circuit it is possible to verify by means of the formula $V = L(\Delta i/\Delta t)$ that the retrace pulses, the amplitude in particular, remain substantially unchanged when the frequency varies, as the variation $\Delta i$ of current i during the retrace period $\Delta t$ is in both cases equal to I.

From this FIG. 2b is also appears that the trace voltage has a lower value when the line frequency is lower. The voltage which is equal to the average value of the voltage of FIG. 2b is shown in this Figure, namely on the left as $v_1$ and on the right as $v_2$.

FIG. 2c shows the variation of the voltage at the collector of transistor $T_3$. The voltage across winding $L_2$ is subjected to a variation of the same form, the average value being zero. The voltage across winding $L_3$ is opposite thereto. As during the trace period outside time period $\tau$ the value of the voltage across winding $L_2$ is substantially zero, this means that the area of the retrace pulse in FIG. 2c is equal to the area of the rectangle in time period $\tau$. From this it appears that the product $V_B \times \tau$ is substantially constant. As in the foregoing voltage $V_B$ is assumed to be constant, also time $\tau$ is therefore substantially constant, that is to say it does not depend on the frequency. Finally, FIG. 2d shows the variation of the current through transformer T. In time period $\tau$ this current flows through winding $L_1$, in the remaining portion of the period it flows through windings $L_2$ and $L_3$, which is shown in FIG. 1 transformed to the primary side.

From the foregoing it does not only appear that the conduction period $\tau$ of transistor $T_3$ is substantially constant at a constant supply voltage $V_B$, but also that its position in the trace period is not important, so that the choice of this position is optional. In practice, the duration of the control pulse of transistor $T_3$ will be adjustable. By means of this adjustment the amplitude of the retrace pulse and consequently amplitude I and also the width of the displayed picture can be adjusted to a desired value. This value does not depend on the line frequency. D.c. voltages which are obtained by rectifying voltages present across further secondary windings of transformer T are thereby adjusted to constant values. $L_4$ in FIG. 1 represents such a secondary winding.

Voltage $V_B$ is constant if its source is a stabilized supply voltage circuit arrangement. If now voltage $V_B$ varies, for example because this voltage is derived by rectification from the electric mains, then the circuit of FIG. 1 can ensure that the amplitude I of the line deflection current as well as the value of the secondary d.c. voltages remain constant. For this purpose time period $\tau$ is controlled in dependence on one of these voltages, for example the voltage derived from winding $L_4$ by means of a diode $D_5$ and a capacitor $C_3$. Driver stage DR comprises a comparison stage in which the voltage of capacitor $C_3$ is compared with a reference voltage $V_{ref}$ for influencing in known manner the conduction period of transistor $T_3$. Herein the longest possible duration of time period $\tau$ is equal to that of the trace period.

The east-west-correction to correct the raster distortion can be carried out in a simple manner with the circuit of FIG. 1 by subjecting time period $\tau$ to a duration modulation of field frequency. To this end a usually parabolic signal $V_{par}$ of the field frequency is applied to driver stage DR. The reference voltage has now become as it were of the field frequency. The parabolic shape must be such that time period $\tau$ is at its maximum for the central horizontal line of the displayed picture, that is to say in the centre of the field trace period, as a result of which also amplitude I is at its maximum, and at a minimum for the top and the bottom horizontal line on the display screen, that is to say at the beginning and at the end of the field trace period, as a result of which amplitude I is also at its minimum. The east-west modulation obtained superimposes a voltage of field frequency on the d.c. voltage of capacitor $C_3$, from which it is apparent that transformer T is not suitable for generating the high voltage for the final anode of the picture display tube.

It will be obvious that a different point, for example the emitter of transistor $T_2$, of the deflection section may be connected to ground. In this respect FIG. I has the advantage that the a.c. voltages at the ends of the deflection coil have equal absolute values and opposite signs, so that the central point of the coil has ground potential. As a result thereof the capacitive radiation of the coil to other portions of the picture display device of which the described circuit forms part, is low.

As high-power transistors usually have a comparatively long turn-off delay time, transistors $T_1$ and $T_2$, which must be turned off simultaneously, may be in the form of gate turn off switches for which the said delay time is much shorter. Alternatively, one or more transistors may be replaced by transistors of the pnp type: so transistor $T_2$ may, for example, be of the pnp-type, the emitter and the collector of which may be interchanged as regards their position as compared to FIG. 1. The circuit of FIG. 1 may be slightly altered without its operation being significantly affected. Capacitors $C_1$ and $C_2$ may, for example, be replaced by one capacitor which is in parallel with either network L, C or with coil L. By means of the capacitors of FIG. 1 the retrace pulse across coil L is better distributed over switches $T_1$, $D_1$ and $T_2$, $D_2$. Neither is it necessary for the capacitors $C_1$ and $C_2$ to have the same capacitance, provided the ratio between the capacitances $C_1$ and $C_2$ is equal to the ratio between the number of turns of windings $L_3$ and $L_2$. In a similar manner as capacitors $C_1$ and $C_2$, diodes $D_1$ and $D_2$ may be replaced by one diode, however on the condition that said diode can withstand the total retrace pulse.

The circuit arrangement may also include known elements, for exmample a centring circuit or a linearity correction device. The deflection coil may be connected to the secondary side of a transformer.

Thanks to a transformer T it is possible to provide a d.c. isolation between the supply section and the deflection section of the circuit arrangement. If no importance is attached to such an isolation, then a transformer may be omitted and transistor $T_3$ may be connected directly to the junction of winding $L_3$ and diode $D_4$ and also to the positive terminal of source $V_B$. In a similar manner transistor $T_3$ may be connected to the junction of winding $L_2$ and diode $D_3$ and also to a negative supply voltage. In both cases the same voltage waveforms as in FIG. 1 are present on the anode of diode $D_3$ and on the cathode of diode $D_4$.

Figure 3:
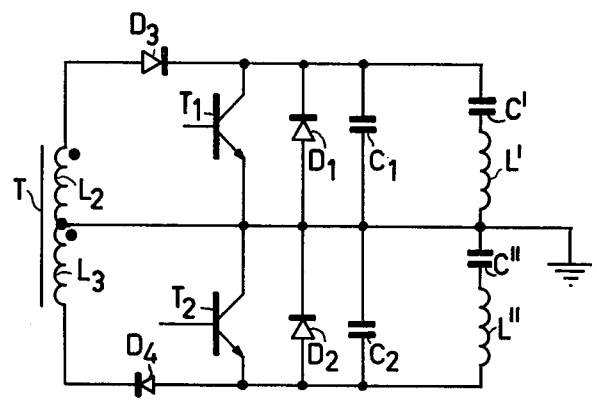
FIGS. 3, 4 and 5 and 6 show variants of the circuit arrangement in accordance with the invention

A further variant of part of the circuit of FIG. 1 is shown in FIG. 3 in which, compared with FIG. 1, the series arrangement L, C is replaced by two series networks L', C' and L'', C''. The junction of both series networks may be connected to ground. The inductances L' and L'' may then be virtually identical line deflection coil halves, while capacitors C' and C'' have substantially equal capacitances.

Figure 4:
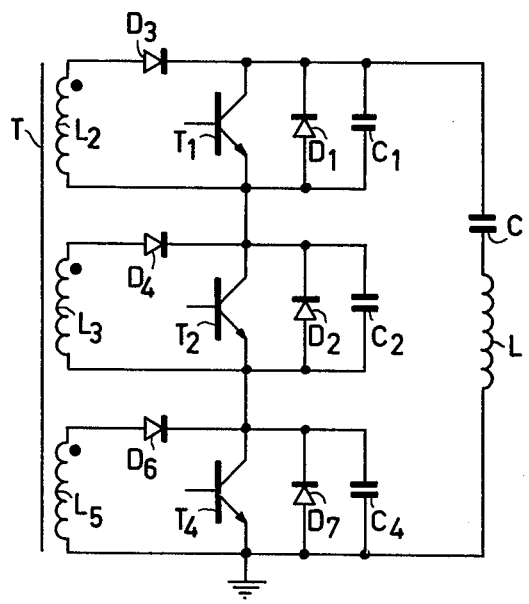

The construction shown in FIG. 4 includes a third deflection circuit wherein a transistor $T_4$, a diode $D_7$ arranged in anti-parallel therewith, a supply winding $L_5$, a supply diode $D_6$ and a retrace capacitor $C_4$ are connected in the same manner as the corresponding elements of FIG. 1. Only the deflection circuits are shown in FIGS. 3 and 4. The third one of these circuits is connected to the second circuit in the same manner as is the second circuit to the first circuit, and the series network L, C is included between the collector of transistor $T_1$ and the emitter of transistor $T_4$, which is connected to ground. It will be obvious that the description of the operation of the circuit shown in FIG. 1 holds without any modification also for the circuit of FIG. 4. Compared with FIG. 1, FIG. 4 has the advantage that the high retrace voltage associated with a short retrace period is now distributed over three instead of over two switches. The circuit of FIG. 4 may of course be optionally extended with one or more deflection circuits and/or be modified in the above-described manners.

In the circuits which have been described so far the transistors in the deflection section are supplied with control signals having a substantially constant duration, as a result of which they conduct during the second half of the trace period while supply transistor $T_3$ conducts during a time period $\tau$ in the trace period, which time period is adjustable or controllable, respectively, as a function of the supply voltage. Compared with the construction shown in FIG. 1, the construction shown in FIG. 5 differs in that transistor $T_1$ combines the function of transistors $T_1$ and $T_3$ of FIG. 1. Herein, winding $L_1$ is connected to the collector of transistor $T_1$ while a diode $D_8$ is included between this collector and the junction of elements $D_1$, $C_1$, C and $D_3$, and that with the same direction of conduction as the collector-emitter path of transistor $T_1$. Transistor $T_2$ is supplied with the same control signal as transistors $T_1$ and $T_2$ in the preceding Figures. In contrast therewith, the control signal of transistor $T_1$ in FIG. 5 has a variable or adjustable duration, so that the amplitude of the deflection current does not vary versus variations of the line frequency or of the supply voltage. This means that for the construction shown in FIG. 5 the control range must be of a somewhat more limited extent than for the preceding Figures.

Figure 5:
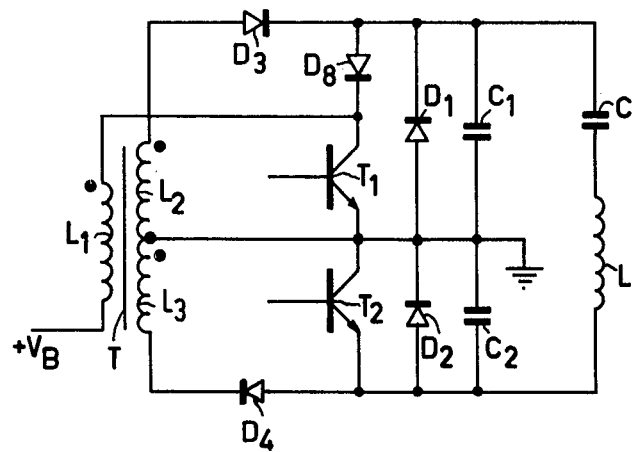

The portion of the circuit shown in FIG. 5 comprising elements $T_1$, $D_1$, $D_3$ and $D_8$ operates in a similar manner as the combined supply voltage and line deflection circuit described in the publication "IEEE Transaction on Broadcast and Television Receivers", August 1972, vol. BTR-18, No. 3, pages 177–182. During the first half of the trace period the deflection current flows through diodes $D_1$ and $D_2$. Transistor $T_2$ is non-conductive while transistor $T_1$ is rendered conductive at an instant which depends on the supply voltage. As the cathode of the conducting diode $D_1$ has a low negative value while the collector of transistor $T_1$ has a low positive value, diode $D_8$ does not conduct. During the second half of the trace period the deflection current flows through diode $D_8$ and transistor $T_1$ and $T_2$. As the emitter of transistor $T_3$ in FIG. 1 is connected to ground, also the emitter of transistor $T_1$ in FIG. 5 must be connected to ground. The waveforms holding for FIG. 5 are the same as in the above-mentioned publication, that is to say the difference compared with the waveforms of FIGS. 2c and 2d is in the fact that the starting moment of time must be located in the first half of the trace period and that the final instant thereof must coincide with the final instant of the trace period.

Figure 6:
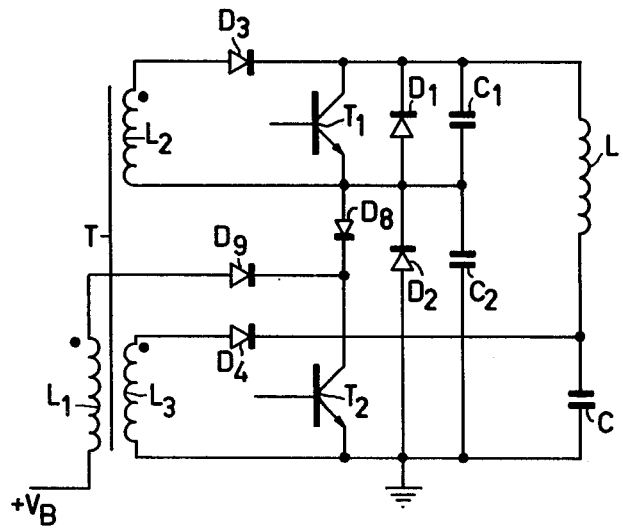

The circuit of FIG. 5 can be modified in different ways. It is, for example, possible to increase in the same manner as in FIG. 4 the number of deflection circuits while one transistor has the combined function. Alternatively, the cathode of a supply diode, for example diode $D_4$ for the case that transistor $T_2$ has the combined functions, may be connected to trace capacitor C instead of to a retrace capacitor. The circuit shown in FIG. 6 is then obtained. Herein the voltages across the windings of transformer T are square-wave voltages. At certain transformation ratios thereof it may be necessary to provide in known manner an isolation diode $D_9$ between winding $L_1$ and the collector of transistor $T_1$, which also applies to the circuit of FIG. 5. In a further variant of the circuit of FIG. 5 the series network of an inductance and a capacitor is in parallel with diode $D_1$ and capacitor $C_1$ and the cathode of diode $D_3$ is connected to the tap of the inductance.

Figure 7:
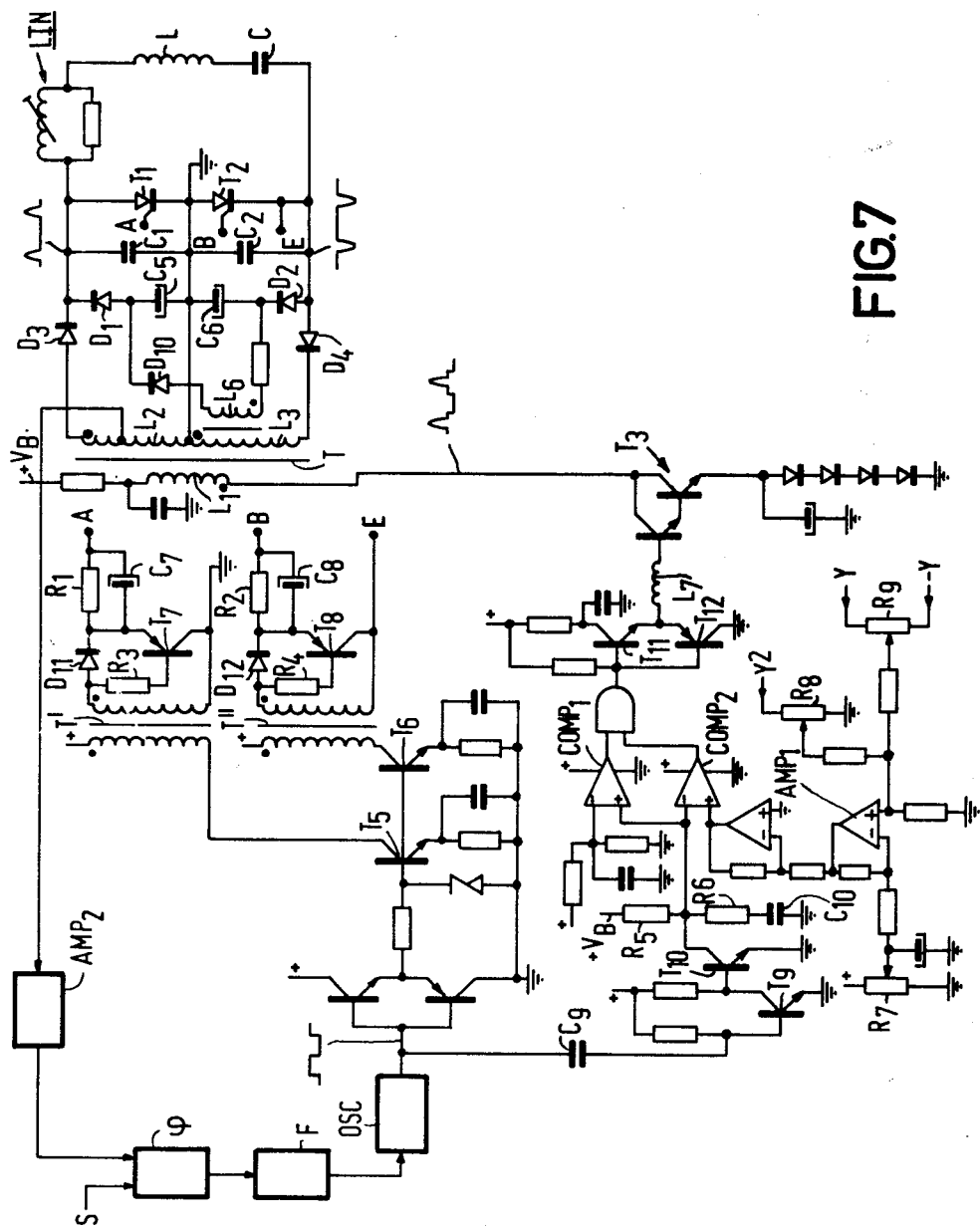
FIG. 7 shows a more detailed circuit diagram.

FIG. 7 shows a more detailed circuit diagram of a construction of the circuit arrangement in accordance with the invention, which is predominantly implemented in accordance with the principle of FIG. 1. Herein $T_1$ and $T_2$ are gate turn off switches, while $T_3$ is in the form of a Darlington pair. The transformation ratio of winding $L_2$ to winding $L_1$ as well as the transformation ratio of winding $L_3$ to winding $L_2$ are equal to 2:1. While the average value of the supply voltage $V_B$ at the primary side of transformer T is 150 V the supply voltage of the further, low-power stages has a stabilised value of 20 V. By means of a secondary winding $L_6$ of transformer T, a diode $D_{10}$ and a limiting resistor a positive voltage of approximately 3 V is generated across a capacitor $C_5$ and a negative voltage of also approximately 3 V across a capacitor $C_6$. Capacitor $C_5$ is included in the anode lead of diode $D_1$ and capacitor $C_6$ is included in the cathode lead of diode $D_2$. This measure ensures that a small current always flows through diodes $D_1$ and $D_2$ during the trace period, which substantially eliminates a distortion of the deflection current in the centre of the trace period when it is taken over by switches $T_1$ and $T_2$. A linearity correction device LIN is included in series with deflection coil L and capacitor C.

A voltage-controlled oscillator OSC generates a substantially symmetrical square-wave voltage of the line frequency which, after having been amplified, is applied to the bases of two driver transistors $T_5$ and $T_6$ which operate as current sources. The collector of transistor $T_5$ is connected to the primary winding of a driver transformer T', the secondary winding of which is connected to the control electrode A of switch $T_1$ via a diode $D_{11}$ and an RC parallel network $R_1$, $C_7$, while the other end of the secondary winding is connected to the cathode of switch $T_1$ and, consequently, to ground. In a similar manner the collector of transistor $T_6$ is connected to the primary winding of a driver transformer T'' the secondary winding of which is connected to the control electrode B of switch $T_2$ via a diode $D_{12}$ and an RC parallel network $R_2$, $C_8$, while the other end of the secondary winding is connected to the cathode E of switch $T_2$. The winding sense of the windings of transformer T' and T'' respectively, has been chosen such that the secondary current flows to electrode A and B, respectively, via diode $D_{11}$ and $D_{12}$, respectively. During the time intervals in which the collector current of transistor $T_5$ and $T_6$, respectively flows and renders switch $T_1$ and $T_2$, respectively, conductive, the capacitor $C_7$ and $C_8$, respectively, is charged.

The emitter of a pnp transistor $T_7$ is connected to the cathode of diode $D_{11}$ while the collector thereof is connected to the cathode of switch $T_1$ and the base is connected to the anode of diode $D_{11}$ via a resistor $R_3$. In a similar manner the emitter of a pnp transistor $T_8$ is connected to the cathode of diode $D_{12}$ while the collector thereof is connected to point E and the base to the anode of diode $D_{12}$ via a resistor $R_4$. During the period of time transistor $T_5$ conducts the secondary current of transformer T' produces a positive voltage drop across diode $D_{11}$ which keeps transistor $T_7$ in the non-conducting stage.

If transistor $T_5$ is rendered non-conductive by the signal from oscillator OSC then the voltage at the primary winding of transformer T' and consequently also at the secondary winding reverses its polarity. This causes the current through the secondary winding to decrease rapidly and to reverse direction, while transistor $T_7$ is rendered conductive because of the voltage of capacitor $C_7$. The base current thereof flows through resistor $R_3$ while diode $D_{11}$ is cutoff. The emitter current removes the charge carriers present in control electrode A, which renders switch $T_1$ non-conductive. By means of transformer T'' and transistor $T_8$ a similar procedure takes place for switch $T_2$. Both switches are rapidly turned on and off substantially simultaneously.

By means of a differentiating capacitor $C_9$ and a transistor $T_9$ a pulse the leading edge of which coincides with the descending edge of the signal from oscillator OSC is applied to the base of a transistor $T_{10}$. The collector resistor $R_5$ is not connected to the low supply voltage but to voltage $V_B$. A series network formed by a low-value resistor $R_6$ and a capacitor $C_{10}$ is in parallel with the collector-emitter path of transistor $T_{10}$. A sawtooth-shaped voltage the slope of which varies versus the fluctuations of voltage $V_B$ is present at the collector of transistor $T_{10}$. The sawtooth-shaped voltage is applied to the non-inverting input terminal of a first comparison stage COMP, and to the inverting input terminal of a second comparison stage $COMP_2$. The inverting input terminal of stage $COMP_1$ is connected to a constant d.c. voltage. The non-inverting input terminal of stage $COMP_2$ is connected via an inverter stage to the output terminal of an amplifier $AMP_1$ by means of which three voltages which are adjustable by means of three trimming potentiometers $R_7$, $R_8$ and $R_9$ are applied to the said input terminal, namely a d.c. voltage, a parabolic voltage of field frequency and a sawtooth voltage of field frequency. The sign of the slope of the last-mentioned voltage is also adjustable. To this end a parabolic voltage $Y^2$, a sawtooth voltage Y having a positive slope and a sawtooth voltage $-Y$ having a negative slope, which are all obtained from a field deflection generator, are applied to amplifier $AMP_1$. The output voltage thereof is consequently parabolic and of the field frequency, it being possible that the parabola is tilted, depending on the position of the wiper of potentiometer $R_9$.

The output terminals of stages $COMP_1$ and $COMP_2$ are connected to the input terminals of an AND-gate the output terminal of which is connected to the bases of two transistors $T_{11}$ and $T_{12}$. The emitters of transistors $T_{11}$ and $T_{12}$ are interconnected and connected via a coil $L_7$ to the control electrode of the Darlington pair of transistors $T_3$. The control signal thereof is consequently a square-wave voltage whose leading edge has a position depending on the voltage at the inverting input terminal of stage $COMP_1$ and consequently occurs a constant period of time after the beginning of the line trace period. The instant at which the trailing edge of the said square-wave voltage occurs depends on the voltage on the non-inverting input terminal of stage $COMP_2$. The width of the displayed picture can be adjusted by means of potentiometer $R_7$, while potentiometer $R_8$ attends to the adjustment of the correction of the east-west raster pin-cushion distortion and potentiometer $R_9$ attends to the adjustment of the correction of the keystone distortion. As resistor $R_5$ is connected to the supply voltage source $V_B$, the instant at which the trailing edge of the control voltage of Darlington pair of transistors $T_3$ occurs depends on voltage $V_B$. This results in a forward control of the conduction period $\tau$ of the Darlington pair of transistors $T_3$ as a function of voltage $V_B$. By means of the choice of the value of resistor $R_5$ it is possible to render the amplitude of the deflection current somewhat independent of the variations in voltage $V_B$, so that the feedback control by means of winding $L_4$ and diode $D_5$ (see FIG. 1) may be omitted.

The retrace pulse present on a tap of winding $L_2$ is applied to an amplifier $AMP_2$ in which amplification and shaping take place. The signal obtained is applied to a phase discrimination $\phi$ to which a line synchronizing signal S is also applied. The output signal of the discriminator $\phi$ is smoothed by a low-pass filter F, which applies a control voltage to oscillator OSC. The phase control loop thus formed ensures that the signal from oscillator OSC and, consequently, the line deflection current flowing through the deflection coil L has the correct frequency and the correct phase relative to signal S.

What is claimed is:

1. In a circuit arrangement for a picture display device for applying a sawtooth-shaped deflection current having a trace and a retrace to a line deflection coil, said coil being connected during the trace period to a trace capacitor by means of at least two series-arranged controllable deflection switches switched at the line frequency, said switches being non-conducting substantially simultaneously during the retrace period, and further circuit components, the deflection coil, the trace capacitor and further circuit components being interconnected to form a retrace capacitance that is part of a resonant network in said retrace period, the elements of said network determining the duration of the retrace period, the circuit arrangement also comprising a supply winding coupled to a supply voltage source for supplying supply energy to the resonant network during the retrace period, the improvement wherein the supply winding is divided into at least two winding portions, one end of each winding portion being connected by means of a separate supply diode to the resonant network, the other end of each winding portion being connected to an associated deflection switch, said winding portions coupled to the supply voltage source via a controllable supply switch also being switched at the line frequency, said supply switch being conducting during at least a portion of the trace period for storing supply energy in the supply winding when the supply diodes are non-conducting and non-conducting during the remaining portion of the line period when the supply diodes are conducting, whereby current flowing through the supply diodes during the retrace period replenishes losses.

2. A circuit arrangement as claimed in claim 1, characterized in that the conduction period of the supply switch is adjustable for the adjustment of the amplitude of the deflection current.

3. A circuit arrangement as claimed in claim 2, characterized in that the conduction period of the supply switch is adjustable in dependence on the supply voltage.

4. A circuit arrangement as claimed in claim 2, characterized in that the conduction period of the supply switch is modulatable at the field frequency for correcting for raster distortion.

5. A circuit arrangement as claimed in claim 1, characterized in that a junction between the deflection switches is connected to a point of reference potential.

6. A circuit arrangement as claimed in claim 1, characterized in that a retrace capacitor and the series arrangement of the associated winding portion and a supply diode are in parallel with each deflection switch, the ratio between the capacitance of the first retrace capacitor and the capacitance of the second retrace capacitor being equal to the ratio between the number of turns of the second winding portion and the number of turns of the first winding portion.

7. A circuit arrangement as claimed in claim 6, characterized in that the series arrangement of a trace capacitor and a line deflection coil half is in parallel with each deflection switch.

8. A circuit arrangement as claimed in claim 1, characterized in that a third deflection switch is arranged in series with the two deflection switches, a third retrace capacitor and the series arrangement of a third winding portion of the supply winding and a third supply diode being in parallel with the third deflection switch.

9. A circuit arrangement as claimed in claim 1, characterized in that the first of said deflection switches comprises the series arrangement of the supply switch which is capable of conduction in one direction only and a diode having the same conductivity direction, while a further diode which conducts into the opposite direction is included in a parallel branch, the junction between the deflection switches being connected to a point of reference potential and the supply switch and the second of said deflection switches being rendered non-conductive substantially simultaneously at the end of the trace period.

10. A circuit arrangement as claimed in claim 1, characterized in that the winding portions are secondary windings of a transformer the primary winding of which is arranged in series with the supply switch, the series arrangement thus formed being connected to the supply voltage source.

11. A circuit arrangement as claimed in claim 1, each deflection switch comprising a controllable switch which is capable of conduction in one direction only and a diode arranged in parallel therewith the conductivity direction of which is opposite to that of the switch, characterized in that a voltage source is arranged in series with each diode for maintaining the diode in the conductive state at least at the turn-on instant of the associated controllable switch.

12. A circuit arrangement as claimed in claim 1, characterized in that the control electrode of a deflection switch is connected to a secondary winding of a driver transformer the primary winding of which is connected to a current source, both windings carrying current simultaneously for bringing to and maintaining the deflection switch in the conductive state and in that the control electrode is also connected to a transistor for rendering the deflection switch non-conductive.

13. A circuit arrangement as claimed in claim 3, characterized in that means for feeding back a retrace voltage to control means for the supply switch is provided for controlling the conduction period thereof.

14. A circuit arrangement as claimed in claim 2, characterized in that control means for the supply switch comprises a sawtooth voltage generator and a comparison stage for generating a pulse-shaped control signal, and edge of the generated control signal being adjustable in dependence on a d.c. voltage and a signal of the field frequency, while the slope of the sawtooth voltage is variable under the influence of the supply voltage.

15. A circuit arrangement as claimed in claim 1, each deflection switch comprising a controllable switch which is capable of conduction in one direction only and a diode arranged in parallel therewith the conductivity direction of which is opposite to that of the switch, characterized in that the two said controllable switches are gate turn off switches.

* * * * *